United States Patent
Bracchitta et al.

[11] Patent Number: 6,020,777
[45] Date of Patent: Feb. 1, 2000

[54] ELECTRICALLY PROGRAMMABLE ANTI-FUSE CIRCUIT

[75] Inventors: John A. Bracchitta, South Burlington; Wilbur D. Pricer, Charlotte, both of Vt.

[73] Assignee: International Business Machines Corporation, Armonk, N.Y.

[21] Appl. No.: 08/938,754

[22] Filed: Sep. 26, 1997

[51] Int. Cl.[7] .................................................. H01H 37/76
[52] U.S. Cl. .......................................... 327/525; 327/526
[58] Field of Search ................................ 327/525, 526; 326/38; 365/96, 225.7

[56] References Cited

U.S. PATENT DOCUMENTS

| | | | |
|---|---|---|---|
| 4,507,757 | 3/1985 | McElroy | 365/104 |
| 4,899,205 | 2/1990 | Hamdy et al. | 357/51 |
| 5,291,434 | 3/1994 | Kowalski | 365/96 |
| 5,334,880 | 8/1994 | Abadeer et al. | 327/525 |
| 5,401,993 | 3/1995 | Yamauchi et al. | 257/321 |
| 5,689,455 | 11/1997 | Mullarkey et al. | 365/96 |
| 5,724,282 | 3/1998 | Loughmiller et al. | 365/96 |
| 5,847,987 | 12/1998 | Cutter et al. | 365/96 |

FOREIGN PATENT DOCUMENTS

| | | | |
|---|---|---|---|
| 712137 | 5/1996 | European Pat. Off. | G11C 17/16 |
| 61-046045 | 12/1987 | Japan | H01L 21/82 |

*Primary Examiner*—Timothy P. Callahan
*Assistant Examiner*—Quan Tra
*Attorney, Agent, or Firm*—Pollock, Vande Sande & Amernick

[57] ABSTRACT

An array of anti-fuse cells forming rows and columns of a matrix is described. The anti-fuse cell includes an MOS capacitor connected to a source of high voltage which is capable of rendering the capacitor permanently conductive. A first voltage limiting transistor connects the free end of the MOS capacitor to a second transistor. An address decoder provides address signals to a source and gate of the second transistor within the cell. The MOS capacitor is rendered permanently conductive when the first and second transistors are rendered conductive. The high voltage is confined to the MOS capacitor, which is fused through the high current being drawn through the capacitor by the first and second transistors. Other components on the integrated circuit carrying the array of fusible cells are maintained free of any high voltage.

13 Claims, 3 Drawing Sheets

ELECTRICALLY PROGRAMMABLE ANTI-FUSE CIRCUIT

BACKGROUND OF THE INVENTION

The present invention relates to electrically programmable integrated circuits. Specifically, a programmable integrated circuit is provided having an array of anti-fuse links which can be activated by applying a higher than usual circuit voltage to an individual anti-fuse link.

Programmable links are used extensively to form programmable read only memory devices. These devices may be user programmed to provide data which is to be used for various circuit trimming functions. Analog type components such as comparators, amplifiers, etc. made in MOS technology may require some parameter adjustments, and fusible links may be used extensively in order to provide a selective trimming of the parameter values. Currently, MOS devices may use up to 100 such fusible links on a single integrated chip. Each fusible link may be individually addressed, and blown using a high intensity laser beam. The blown fusible link interrupts a current path whose change of state from conducting to non-conducting represents a logic state.

A limitation on using such fusible links includes the large amount of power dissipation necessary to blow them. The necessary power cannot be achieved in smaller sized fusible links, thus inhibiting a reduction of their size comparable to the reduction in size of other circuit components used in an integrated circuit.

The anti-fuse device is similar, however it is blown by applying a higher than normal voltage to the anti-fuse, which produces a short circuit where an open circuit once existed. This change in state also represents a change in logic state which may be used to store data.

In order to keep the pinout low on integrated circuit packages which utilize the anti-fuses, addressing schemes are provided so that individual anti-fuses may be addressed with a small number of external pin connections to the integrated circuit chip.

Future increases in circuit density and the corresponding increase in the number of devices on an integrated circuit will increase the need for more anti-fuse devices for circuit trimming functions. Whereas presently such circuit devices may include up to 100 fusible links, the need for additional fusible links, in the 300 to 500 link range is becoming necessary.

The anti-fuse device generally comprises two conductors, either metal and/or a semiconductor material having some kind of dielectric or insulating material between the two conductors. In the recent past this dielectric was set to approximately half the normal thickness of a FET thin oxide gate, so that in the presence of a high voltage, it was electrically broken down to change from a non-conducting state to a conducting state, while not affecting in any permanent way the remaining components which have thicknesses two or more times that of the dimension between the conductors of an anti-fuse.

As integrated circuit density keeps increasing, it is becoming more difficult to reduce the thickness of the anti-fuse insulator. For instance, gate insulator thickness is now approaching 50 Å. Manufacturing transistors with insulator thicknesses half this distance can result in other deleterious effects occurring, such as tunnelling between conductors which would then be spaced only 25 Å apart.

The physical size limitations represented by these higher densities on the smaller anti-fuse devices makes it impossible to maintain a high voltage differential between the fusing potential of the anti-fuse device and that of other integrated circuit devices which are not intended to be fused. For these reasons, it is desirable for higher density integrated circuit packages to provide adequate isolation between the higher voltages applied to fuse the anti-fuse link and the remaining components in the circuit.

SUMMARY OF THE INVENTION

It is an object of this invention to provide a high density array of anti-fuse links.

It is a more specific object of this invention to provide an anti-fuse link which is blown by applying a high voltage while isolating the remaining circuit components of an integrated circuit from the high voltage.

These and other objects are provided for by an array of anti-fuse cells. Each anti-fuse cell includes an MOS capacitor connected to a high voltage bus supplied by a tester. A field effect transistor (FET) is coupled to a row (word) line and to a column (bit) line, and to the MOS capacitor through a voltage limiting device. The anti-fuse link is blown when the bit line and word line render the FET transistor conductive. Substantially all of the high voltage is then placed across the MOS capacitor resulting in the capacitor arcing over and drawing a current which destroys a narrow filament of the dielectric and fuses the metal plates thereof together.

The state of the MOS capacitor, either being conductive or non-conductive, may be sensed by either a voltage sensitive circuit or a latch circuit connected to the junction of the voltage limiting element and the transistor. The latch circuit thereafter assumes a state which represents the conductive state of the capacitor. In a preferred embodiment of the invention, the voltage limiting device is also a field effect transistor having a drain connected to one end of the capacitor. The source of the voltage limiting field effect transistor is connected to the drain of the first field effect transistor, and the gate is connected to a voltage substantially less than the high voltage applied by the tester to the MOS capacitor. The second, voltage limiting, field effect transistor effectively maintains the voltages on all other components within the integrated circuit at a safe level.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DETAILED DESCRIPTION OF THE PREFERRED EMBODIMENTS

Figure 1:
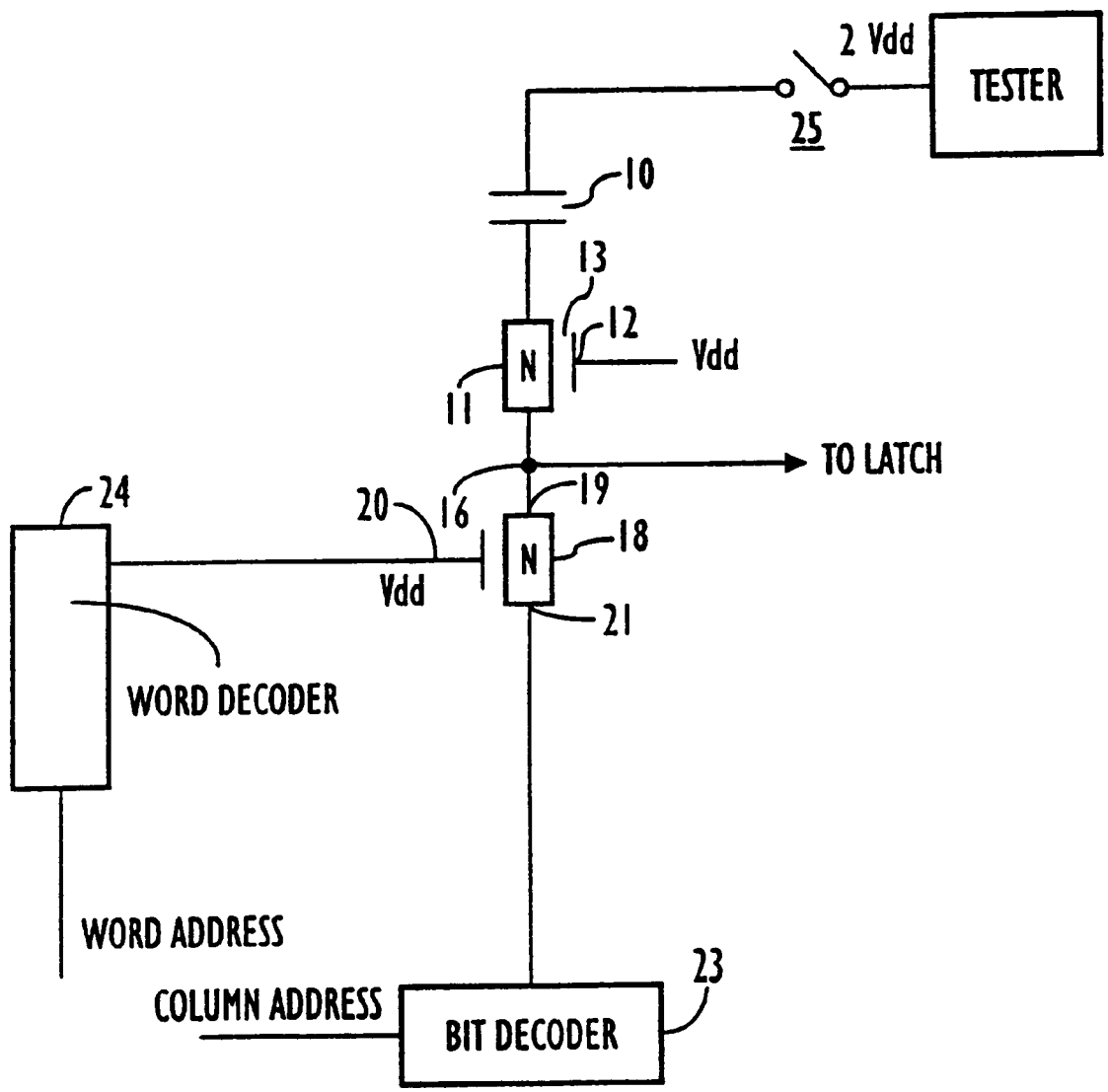
FIG. 1 is a schematic drawing of an anti-fuse cell in accordance with the preferred embodiment of the invention.

Referring now to FIG. 1, there is shown an anti-fuse cell in accordance with a preferred embodiment of the invention. The anti-fuse cell includes an MOS capacitor 10 which is connected on one side thereof to a high voltage bus of a tester used to program the cell. The MOS capacitor 10 is normally in an open, non-conductive state, which can be changed to a permanent conductive state representing a logic 1, from the open condition representing a logic 0 state.

An NMOS transistor 18 is shown having a source 21 connected to a bit line of a bit decoder 23. The gate 20 of NMOS transistor 18 is connected to a word line of a word decoder 24.

A junction 16 is formed between the drain 19 of the NMOS transistor 18 and the source 13 of a second NMOS transistor 11. NMOS transistor 11 has a gate connection 12 connected to a voltage source Vdd which is one half the value of the high voltage 2 Vdd which is used to blow the capacitor 10. The drain connection 14 of the NMOS transistor 11 is connected to the remaining side of the MOS capacitor 10.

During a programming operation which changes the state of MOS capacitor 10 from an open circuit condition to a permanently conductive state, the tester applies via switch 25 a high voltage 2 Vdd to one side of the MOS capacitor 10. The high voltage exceeds the catastrophic breakdown voltage of the dielectric which destroys the dielectric and renders MOS capacitor 10 conductive. At the same time, an address is supplied to the word decoder 24 and bit decoder 23 identifying the antifuse cell to be blown. The appropriate address line from decoder 24 applies a potential Vdd to gate 20 of NMOS transistor 18, and the bit line from bit decoder 23 applies zero volts to the source 21 of transistor 18. Before the MOS capacitor 10 is placed in the permanently conductive state, junction 16 resides at substantially 0 volts. The result is conduction through NMOS transistor 18 and NMOS transistor 11, placing the full high voltage 2 Vdd across MOS capacitor 10. The potential 2 Vdd across the MOS capacitor 10 results in a breakdown of the dielectric of MOS capacitor 10.

MOS capacitor 10 may be formed by implanting a dopant species in the channel region of a field effect transistor (FET) which has the same polarity as the source and drain (i.e., N-type or P-type dopants). The gate constitutes one side of the capacitor and the source and drain the other side of the capacitor. The dielectric is reliably blown by the action of the high electric fields and an excessive Fowler-Nordheim tunneling current produced by the voltage potential 2 Vdd. The high potential 2 Vdd is isolated from the remaining portion of the anti-fuse cell by the voltage limiting MOS transistor 11. Once the MOS capacitor 10 has been rendered permanently conductive, the voltage at junction 16 rises from substantially 0 to a value about equal to Vdd minus Vt, the threshold voltage for NMOS transistor 11. Junction 16 is coupled in a preferred embodiment to a latch, which has its state set in accordance with the value of the potential on junction 16.

Alternatively the state of the anti fuse can be sensed by a voltage sensitive circuit coupled to junction 16 with a small voltage of approximately 200–300 mv applied to the word line.

Figure 2:
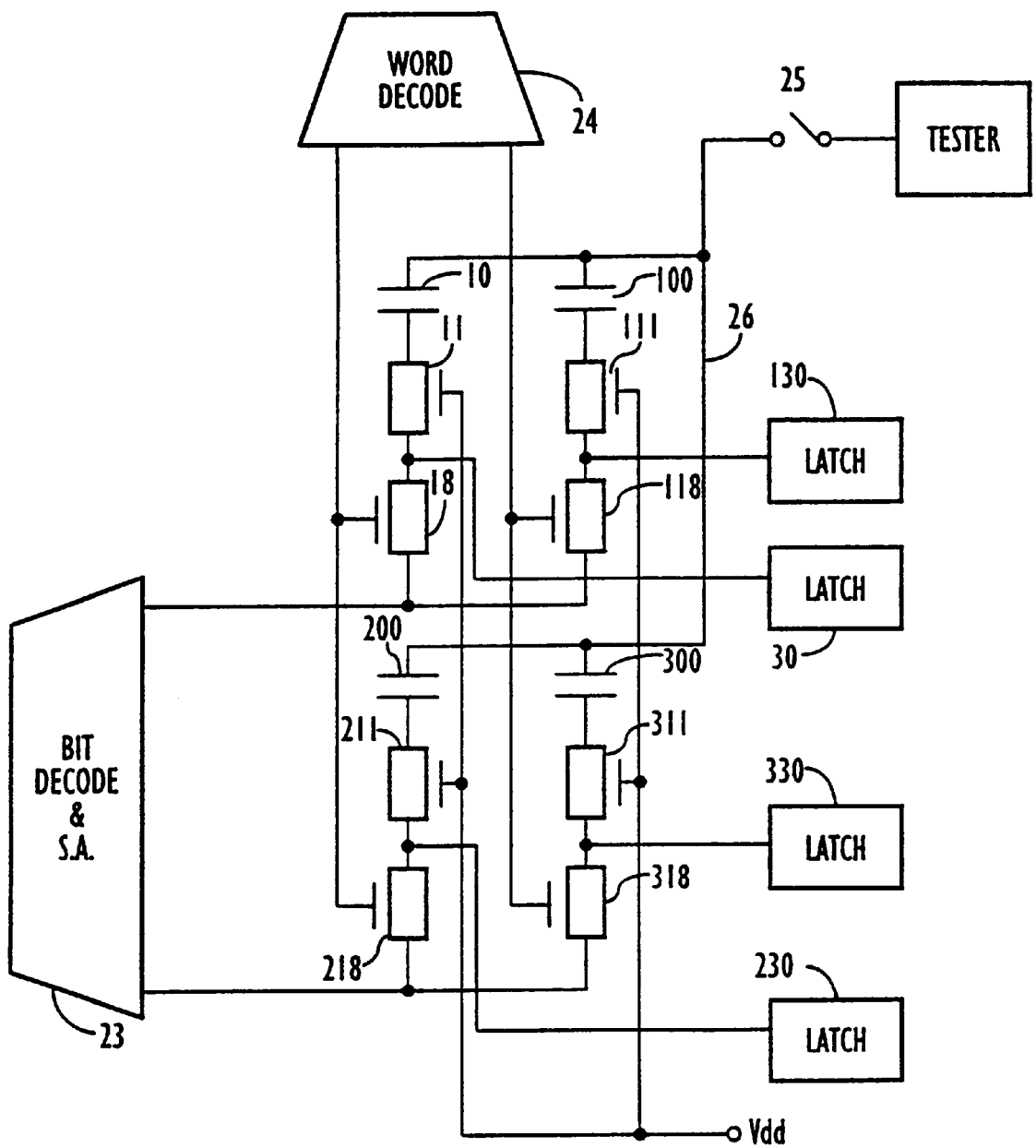
FIG. 2 illustrates an array of anti-fuse cells which can be selectively addressed and blown.

The use of the anti-fuse cell of FIG. 1 in an array such as a 4-bit PROM is illustrated in FIG. 2. While the 4-bit PROM is exemplary, it is clear that the 4-bit PROM can be increased to conventional size and include more cells. However, for purposes of illustrating the preferred embodiment, a 4-cell PROM is shown in FIG. 2.

Referring now to FIG. 2, four individual cells are shown in an array. Like components of anti-fuse cells 0, 1, 2 and 3 are labeled with a series of numbers 10–18, 100–118, 200–218 and 300–318. Additionally, separate latches for each cell are shown, having corresponding numbers of 30, 130, 230, and 330. A high voltage rail 26 from the tester switch 25 initiates an anti-fuse blowing operation. The tester switch 25 places 2 Vdd on a high voltage rail 26. The state of each anti-fuse cell 0, 1, 2, and 3 is reflected in the state of latches 30, 130, 230 and 330. Each of the cells have a voltage limiting transistor 11, 111, 211 and 311. A cell can be selected for having the NMOS transistor rendered conductive by a potential Vdd on the word line of the cell, and a potential of substantially 0 volts on the bit line connected to the cell. Cell 1 can be addressed for blowing and the high voltage 2 VDD is applied to rail 26 and NMOS transistor 11. The high voltage 2 VDD is limited to the rail 26, and the remaining components in the array are effectively isolated from the high voltage by NMOS transistor 11. The addressed cell blows the capacitor by virtue of returning the opposite side of the MOS capacitor 11 to 0 volts when a respective NMOS transistor 18 is addressed. All other bit lines are kept at the higher Vdd potential.

The voltage potential at the junction of the two NMOS transistors 11, 18 of the cell sets the value of a corresponding latch. The latch, in turn, may be connected to any functional logic to implement the function of that logic according to the state of the MOS capacitor of the cell connected to the latch.

Figure 3:
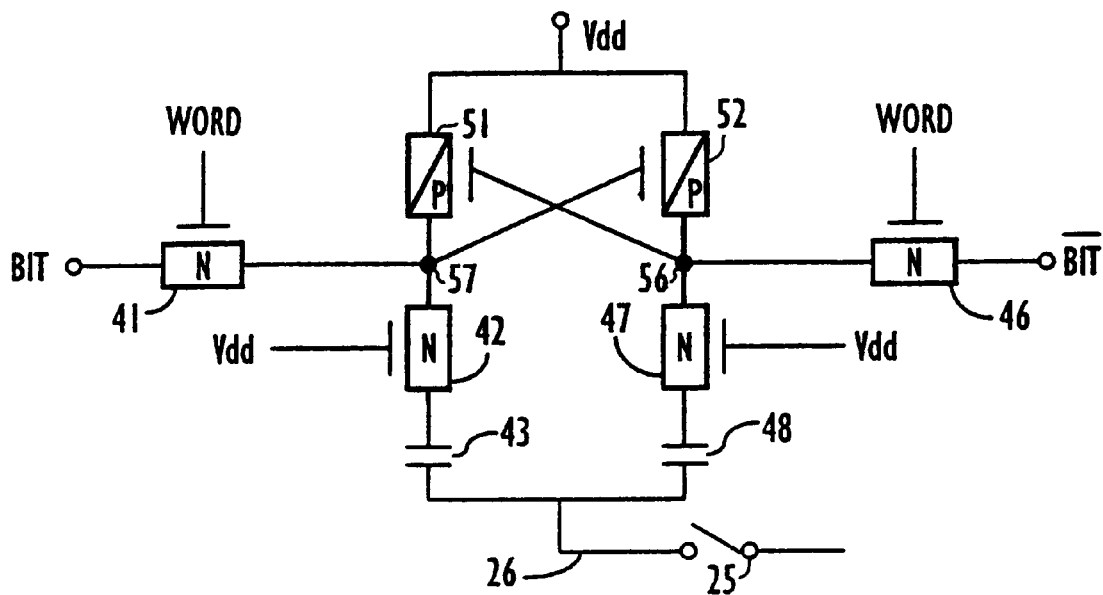
FIG. 3 is another embodiment of the invention which illustrates a cross coupled latch activated by a pair of anti-fuse cells.
Figure 4:
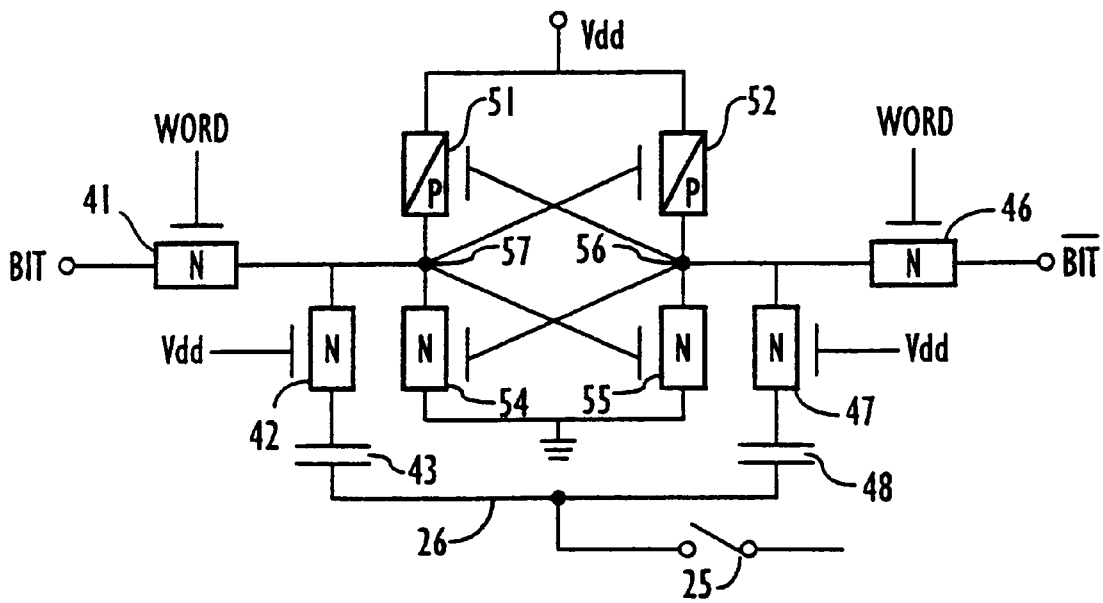
FIG. 4 illustrates another embodiment of the invention which illustrates an anti-fuse cell which can be trial set and read to determine its state.

Two other embodiments of the invention are illustrated in FIGS. 3 and 4. Each of these embodiments provide for complementary outputs from a cross coupled latch controlled by the state of two anti-fuses which are incorporated in the latch. Two anti-fuse cells are connected to a common latch. Each anti-fuse cell comprises NMOS transistors 41 and 42, and capacitor 43 as well as NMOS transistors 46 and 47 and capacitor 48. The anti-fuse cells are connected to the high voltage rail 26 carrying a potential of 2 Vdd.

The state of each NMOS capacitor 43 and 48 is controlled by the bit and word lines connected to NMOS transistor 41, and the word and inverted bit lines connected to transistor 46. As with the previous embodiment, the state of capacitors 43 or capacitor 48 can be rendered conductive by addressing one or the other of the NMOS transistors 41 and 46.

PMOS transistors 51 and 52 are shown in the cross coupled mode, the gate of one transistor being connected to the drain of the other transistor, and a common source connection connected to a supply voltage Vdd. The state of the latch is set, based on the state of each of MOS capacitors 43 and 48. Complementary outputs are provided by each of nodes 57 and 56 of the cross coupled latch. These outputs may be applied to functional logic for controlling circuit component parameters.

The embodiment of FIG. 4 includes two additional NMOS transistors 54 and 55 as part of the cross coupled latch. NMOS transistors 54 and 55 have their drain connections connected to the nodes 57 and 56, their source connections connected to a common connection and their gates connected to nodes 57 and 56.

The embodiment of FIG. 4 permits the establishment of a state for each of the MOS capacitors 43 and 48 by addressing both transistors 41 and 46 with the appropriate word line and bit line or inverted bit line. The embodiment of FIG. 4 also permits the establishment of a state for the cross coupled latch without blowing gate MOS capacitors 43 and 48 by addressing the transistors 41 and 46, to set the latch to one of two states. In this way, a trial setting for the latch may be established before blowing the MOS capacitors 43 and 48. Once a proper setting for the latch has been found, the appropriate MOS capacitor may be blown by closing switch 25 on the tester and addressing the transistors 41 and 46 to permanently set the latch in the desired state.

The embodiment of FIG. 4 also permits the interrogation of the state of the individual MOS capacitors 43 and 48. If the current through the bit or inverted bit connection of NMOS transistors 41 and 46 is read when the transistors are addressed, an indication is provided as to whether or not MOS capacitors 43 or 48 have been blown.

Thus, there is described with respect to several embodiments a new anti-fuse cell in accordance with the present invention. Those skilled in the art will recognize yet other embodiments of the invention described more particularly by the claims which follow.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A fusible cell comprising:
   an MOS capacitor connected on one side to a source of voltage which produces a permanent conductive state in said capacitor;
   a transistor having a gate connection connected to receive a first address signal, and source connected to receive a second address signal; and
   a voltage limiting element connected between said transistor and a remaining end of said capacitor, said voltage limiting element limiting the voltage applied to said transistor when said MOS capacitor is rendered conducting; and
   a voltage sensing circuit coupled to said transistor for identifying the state of said fusible cell.

2. The fusible cell according to claim 1 wherein said voltage sensing circuit is a latch circuit coupled to said transistor for identifying the state of said fusible cell.

3. An electrical fusible cell comprising:
   an MOS capacitor having a dielectric which in has a threshold voltage which renders said capacitor permanently conductive, one side of said capacitor being connected to a source of voltage higher than said threshold voltage;
   a first FET transistor having a drain electrode connected to a remaining side of said capacitor and having a gate electrode connected to a source of voltage potential less than said breakdown voltage;
   a second FET transistor having a drain electrode connected to a source electrode of said first FET transistor, said second FET transistor having a gate electrode connected to receive a first address signal, and a source of said second FET transistor connected to receive a second address signal whereby said MOS capacitor is rendered permanently conductive when said address signals enable conduction of said second FET transistor; and
   means connected to said first FET transistor source electrode which produces a voltage which indicates a state of said MOS capacitor.

4. The electrical fusible cell according to claim 3 wherein said MOS capacitor is a FET transistor having a gate electrode constituting one side of said MOS capacitor, and a drain and source constituting said remaining side of said MOS capacitor.

5. The electrical fusible cell according to claim 3 wherein said means is a bistable latch connected to said first FET transistor, said latch assuming a state which represents the state of said fusible cell.

6. An array of fusible cells comprising: a plurality of fusible cells forming rows and columns of a matrix, each of said cells comprising:
   an MOS capacitor connected at one end in series with first and second transistors, and connected at another end to a source of voltage which exceeds a threshold voltage for rendering said MOS capacitor permanently conductive;
   a first address decoder for providing a common address signal to each of said second transistors of a column of said matrix; and
   a second address decoder for providing a common address signal to each of said second transistors of a row of said fusible cells, whereby any of said MOS capacitors may be rendered permanently conducting by an address supplied to said first and second address decoders.

7. The array of fusible links according to claim 6 further comprising a bistable latch coupled to each of said fusible cells, said latch assuming a state according to whether said MOS capacitor is in a conducting or non-conducting state.

8. The array of fusible cells according to claim 6 wherein a first address signal is applied to gates of said second transistors of said column, and a second address signal is applied to sources of said second transistor of said row.

9. The array of fusible cells according to claim 6 wherein a gate of each of said first transistors of said array is connected to a voltage source which is less than said threshold voltage.

10. A fusible cell comprising:
    a first MOS capacitor connected at one side to a source of voltage which is capable of rendering said MOS capacitor in a permanently conducting state, and serially connected at a remaining side to first and second transistors;
    a second MOS capacitor connected to said one side of said source of voltage which is capable of rendering said second MOS capacitor into a permanently conducting state, and serially connected on a remaining side to third and fourth transistors;
    fifth and sixth cross coupled transistors having source electrodes connected to a first terminal of a source of operating voltage, and having a drain electrode connected to a first junction formed between said first and second transistors, and a second junction formed between said third and fourth transistors, respectively, a gate of said fifth transistor being connected to said second junction and a gate of said sixth transistor being connected to said first junction, said junctions providing complementary outputs representing the state of said first and second MOS capacitors.

11. The fusible cell of claim 10 further comprising a seventh and eighth transistors serially connecting said first and second junctions to a second terminal of said source of operating voltage.

12. The fusible cell according to claim 10 wherein said second and fourth transistors are connected to receive address signals which render said first and second MOS capacitors in a permanently conducting state.

13. The fusible cell according to claim 10 wherein said first and third transistors have a gate connection which is coupled to a source of voltage potential which is less than the voltage for rendering said first and second MOS capacitors conductive.

* * * * *